United States Patent
Nobori et al.

(10) Patent No.: US 12,198,965 B2
(45) Date of Patent: Jan. 14, 2025

(54) MEMBER FOR SEMICONDUCTOR MANUFACTURING APPARATUS, METHOD FOR MANUFACTURING THE SAME, AND MOLD

(71) Applicant: NGK INSULATORS, LTD., Nagoya (JP)

(72) Inventors: Kazuhiro Nobori, Nagoya (JP); Takuji Kimura, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 990 days.

(21) Appl. No.: 16/822,579

(22) Filed: Mar. 18, 2020

(65) Prior Publication Data

US 2020/0312693 A1   Oct. 1, 2020

(30) Foreign Application Priority Data

Mar. 26, 2019 (JP) .................................. 2019-058056

(51) Int. Cl.
  *H01L 21/683* (2006.01)
  *B28B 1/14* (2006.01)
  (Continued)

(52) U.S. Cl.
  CPC ............ *H01L 21/6833* (2013.01); *B28B 1/14* (2013.01); *B28B 7/164* (2013.01); *B28B 11/243* (2013.01);
  (Continued)

(58) Field of Classification Search
  CPC ......... H01L 21/00; H01L 21/02; H01L 21/48; H01L 21/60; H01L 21/67; H01L 21/6833;
  (Continued)

(56) References Cited

U.S. PATENT DOCUMENTS 5,539,609 A * 7/1996 Collins ............... H01L 21/6831
                                                          361/234
2002/0075625 A1* 6/2002 Sexton ............... H01L 21/6831
                                                          361/234
(Continued)

FOREIGN PATENT DOCUMENTS

CN             1868031 A    11/2006
CN           103325714 A     9/2013
(Continued)

OTHER PUBLICATIONS

D. H. Jung, A. Sharma, M. Mayer and J. P. Jung, "A Review on Recent Advances in Transient Liquid Phase (TLP) Bonding for Thermoelectric Power Module", Aug. 23, 2018, 1Department of Materials Science and Engineering, University of Seoul. (Year: 2018).*

(Continued)

*Primary Examiner* — Jeffrey M Wollschlager
*Assistant Examiner* — Edgaredmanuel Troche
(74) *Attorney, Agent, or Firm* — BURR PATENT LAW, PLLC

(57) ABSTRACT

A member for a semiconductor manufacturing apparatus includes a ceramic disc incorporating an electrode and a ceramic cylindrical shaft supporting the disc. The disc and the shaft are integrally formed and mutually have no bonding interface. The disc has a surface with which the shaft is integrated. The surface has a region inside the shaft and a region outside the shaft. The region inside the shaft is recessed by one step with respect to the region outside the shaft and has an electrode exposure hole through which the electrode is exposed.

3 Claims, 11 Drawing Sheets

(51) Int. Cl.
*B28B 7/16* (2006.01)
*B28B 11/24* (2006.01)
*C23C 16/458* (2006.01)
*H01J 37/32* (2006.01)
*H01L 21/67* (2006.01)

(52) U.S. Cl.
CPC .... *C23C 16/4582* (2013.01); *H01J 37/32715* (2013.01); *H01L 21/67017* (2013.01)

(58) Field of Classification Search
CPC ......... H01L 23/32; H01L 23/34; H01L 31/00; H01L 31/0224; H01L 31/0248; H01L 31/0352; H01L 2021/60; H01L 2021/601; H01L 21/68792; H01L 21/68785; B28B 1/14; B28B 11/243; B28B 11/006; B28B 1/44; C23C 16/4582; H01J 1/00; H01J 1/02; H01J 1/35; H01J 37/32532; H01J 37/3438; H01J 37/32541–32605; C04B 37/00
See application file for complete search history.

(56) References Cited

U.S. PATENT DOCUMENTS

| | | | | |
|---|---|---|---|---|
| 2003/0003749 | A1* | 1/2003 | Sexton | H01L 21/67103 438/694 |
| 2004/0173161 | A1* | 9/2004 | Mariner | H05B 3/143 118/728 |
| 2006/0191639 | A1 | 8/2006 | Tanaka et al. | |
| 2006/0219176 | A1 | 10/2006 | Tomita et al. | |
| 2008/0174930 | A1 | 7/2008 | Hattori et al. | |
| 2009/0235866 | A1 | 9/2009 | Kataigi et al. | |
| 2011/0254236 | A1* | 10/2011 | Brugger | H01L 21/68792 279/125 |
| 2013/0248509 | A1* | 9/2013 | Unno | H05B 1/0233 219/521 |
| 2013/0319762 | A1* | 12/2013 | Harris | H01L 21/67248 156/60 |
| 2019/0139805 | A1 | 5/2019 | Muneishi | |

FOREIGN PATENT DOCUMENTS

| | | | | |
|---|---|---|---|---|
| EP | 2624291 A1 * | 8/2013 | | B23B 31/307 |
| JP | H10-242252 A1 | 9/1998 | | |
| JP | 2003-142564 A1 | 5/2003 | | |
| JP | 2005-244350 A | 9/2005 | | |
| JP | 2006-232576 A1 | 9/2006 | | |
| JP | 2009-256789 A1 | 11/2009 | | |
| JP | 2013-225663 A1 | 10/2013 | | |
| JP | 2019-031434 A1 | 2/2019 | | |
| WO | 2017/188189 A1 | 11/2017 | | |

OTHER PUBLICATIONS

W. D. MucDonald and T. W. Eagar, "Transient Liquid Phase Bonding", (1992), Department of Materials Science and Engineering, Massachusetts Institute of Technology, Cambridge, Massachusetts 02139. (Year: 1992).*

HAN_NPL; Machine English translation of KR-20070077859-A (HAN) (Year: 2007).*

Machine English translation of EP 2 624 291 A1 (MAFLER) (Year: 2013).*

Taiwanese Office Action (Application No. 109109395) dated Apr. 9, 2021.

Japanese Office Action (Application No. 2019-058056) dated Feb. 9, 2021 (with English translation).

Cheng Huiming, "*Advanced Electronic Manufacturing Technology,*" National Defense Industry Press Dec. 31, 2008.

An Jiangying et al., "*Higher Vocational Education Graduation Design (thesis) Guidance Manual Mechanical and Numerical Control Volume,*" China Light Industry Press, Jan. 2015.

Wu Xiangming et al., "*Plastic Mold Design Guide 3rd Edition,*" National Defense Industry Press, Jan. 2012.

Chinese Office Action (with English translation) dated Jun. 1, 2023 (Application No. 202010214673.2).

"*Engingeering Ceramic Material,*" Yinhau et al., p. 127, Xi'an Jiaotong University Press, Sep. 30, 2000.

Chinese Office Action (with English translation) dated Nov. 21, 2023 (Application No. 202010214673.2.

Inamori, Kazuo, "*The Working Method,*" pp. 60-61, China press, Jun. 2010.

Chinese Office Action (with English translation) dated Sep. 8, 2023 (Application No. 202010214673.2).

Korean Office Action (Application No. 10-2020-0035055) dated Jul. 2, 2021 (with English translation).

"*Chemical Synthesis and Property Analysis of Electroceramics,*" Yudong Hou et al., pp. 13-14, Metallurgical Industry Press, Aug. 2018.

"*Physical Properties of Materials 2nd Edition,*" Wucheren et al., p. 44, Wartheast Technology University Press, Dec. 2018.

Chinese Office Action (with English translation) dated May 6, 2024 (Application No. 202010214673.2).

* cited by examiner

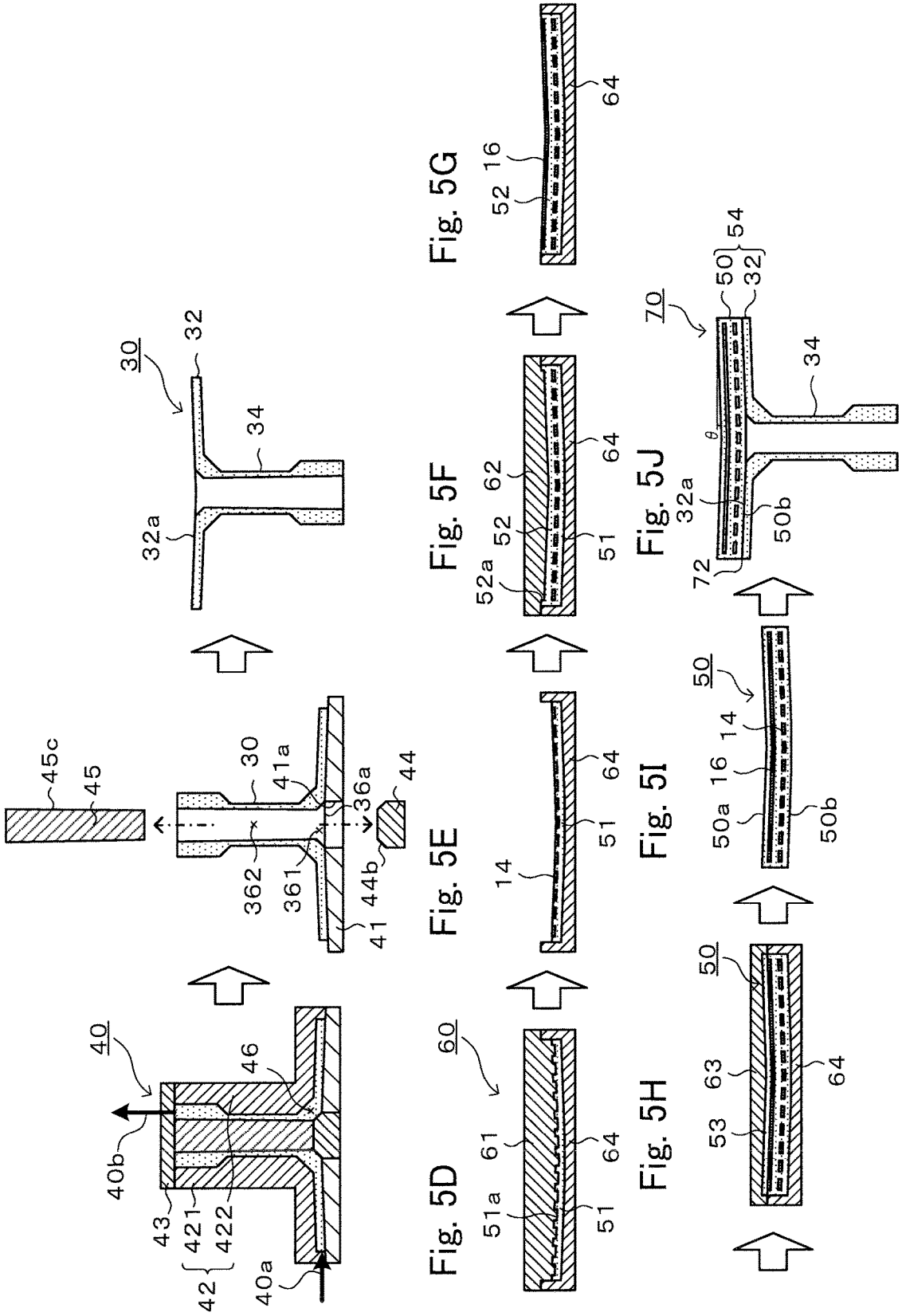

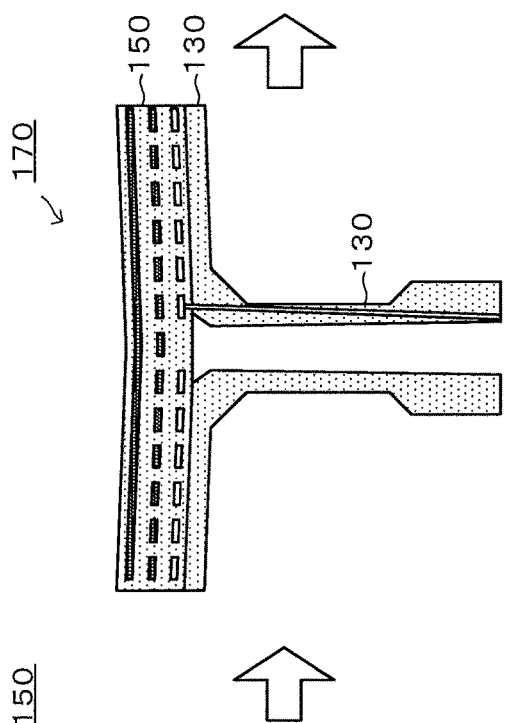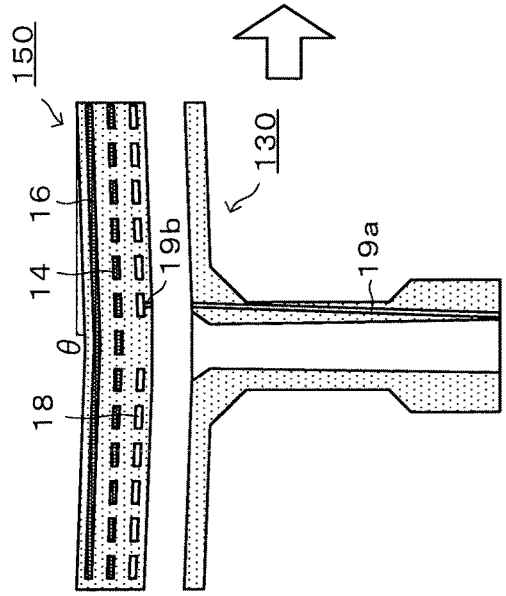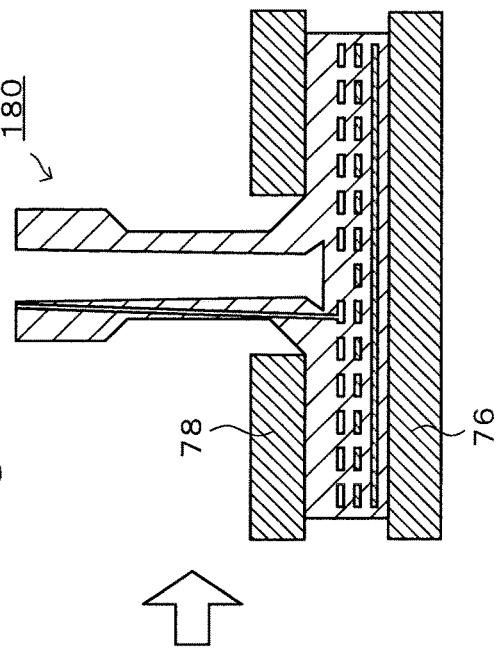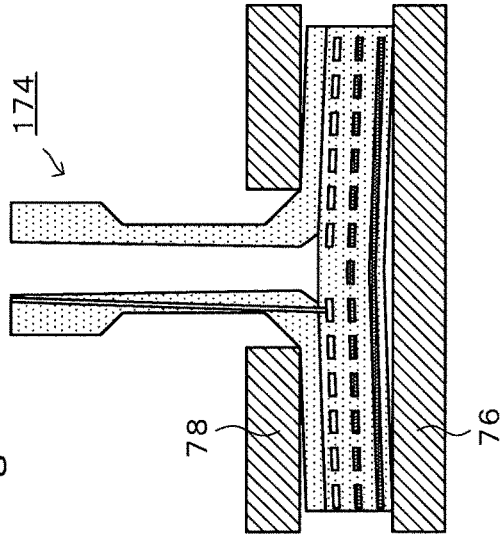

MEMBER FOR SEMICONDUCTOR MANUFACTURING APPARATUS, METHOD FOR MANUFACTURING THE SAME, AND MOLD

BACKGROUND OF THE INVENTION

1. Field of the Invention

The present invention relates to members for semiconductor manufacturing apparatuses, methods for manufacturing such members, and molds.

2. Description of the Related Art

In the related art, members for semiconductor manufacturing apparatuses are known, such as ceramic heaters including a ceramic disc incorporating an electrode and a ceramic shaft supporting the disc. To manufacture such a member for a semiconductor manufacturing apparatus, for example, as disclosed in PTL 1, a disc and a shaft are separately produced by firing and are then bonded in contact with each other by heat treatment. However, if the disc and shaft that have been fired once are bonded together by heat treatment, a thermal history is applied twice. This poses a problem in that sintered particles grow, thus decreasing the strength of the disc and the shaft and, in rare cases, causing bonding interface separation. On the other hand, a member for a semiconductor manufacturing apparatus in PTL 2 is manufactured by integrally forming a disc and a solid shaft before firing. This requires a thermal history to be applied only once, which results in less growth of sintered particles, thus increasing the strength and preventing bonding interface separation.

CITATION LIST

Patent Literature

PTL 1: JP 2006-232576 A
PTL 2: JP No. 10-242252 A (paragraph 0008, FIG. 3)

SUMMARY OF THE INVENTION

However, it is difficult to provide the solid shaft of the member for a semiconductor manufacturing apparatus in PTL 2 with a power supply member for supplying electric power to an electrode. Even if a hollow shaft is used, a relatively deep hole for the power supply member needs to be formed in the disc. This poses a problem in that such a member for a semiconductor manufacturing apparatus is not easy to manufacture.

The present invention has been made to solve the foregoing problems. A primary object of the present invention is to provide a member, for a semiconductor manufacturing apparatus, that suffers no separation, that has high strength, and that is relatively easy to manufacture.

A member for a semiconductor manufacturing apparatus according to the present invention is a member for a semiconductor manufacturing apparatus, including a ceramic disc incorporating an electrode and a ceramic cylindrical shaft supporting the disc,
   wherein the member for a semiconductor manufacturing apparatus has no bonding interface,
   the disc has a surface with which the shaft is integrated, the surface having a region inside the shaft and a region outside the shaft, and
the region inside the shaft is recessed by one step with respect to the region outside the shaft and has an electrode exposure hole through which the electrode is exposed.

This member for a semiconductor manufacturing apparatus has no bonding interface and thus suffers no bonding interface separation. In addition, such a member for a semiconductor manufacturing apparatus can be produced by firing a casting including a disc and a shaft that are integrated together only once (by applying a thermal history once). This allows for less growth of sintered particles than applying a thermal history twice to the disc and the shaft, thus increasing the strength. Furthermore, the region of the disc inside the shaft is recessed by one step with respect to the region outside the shaft, so that the electrode exposure hole in the region inside the shaft is shallow. Thus, the electrode exposure hole can be more easily formed than a deep electrode exposure hole.

The shaft of the member for a semiconductor manufacturing apparatus according to the present invention may have an inner space including a first space extending from a position at a predetermined height with respect to the region of the disc inside the shaft to the region of the disc inside the shaft. The first space may have a frustoconical shape whose diameter increases from the position at the predetermined height toward the region of the disc inside the shaft. As a method for manufacturing the member for a semiconductor manufacturing apparatus, it is possible to integrate and fire two castings for producing the member for a semiconductor manufacturing apparatus (a base compact including an unfired shaft and an unfired annular layer that are integrated together and a disc compact having an electrode). If this method is employed, the base compact has a space corresponding to the first space. When this space is formed using a first core rod of a mold, the first core rod can be smoothly withdrawn after the formation of the base compact. Here, the inner space of the shaft may include a second space extending from the position at the predetermined height to an opening of the shaft. The second space may have a frustoconical shape whose diameter increases from the position at the predetermined height toward the opening of the shaft. In the method of manufacture described above, the base compact also has a space corresponding to the second space. When this space is formed using a second core rod of the mold, the second core rod can be smoothly withdrawn after the formation of the base compact.

The electrode of the member for a semiconductor manufacturing apparatus according to the present invention may be at least one of a heater electrode, a radio-frequency (RF) electrode, and an electrostatic electrode. Such an electrode is preferably parallel to the plane of the disc.

The disc of the member for a semiconductor manufacturing apparatus according to the present invention may have a gas passage that is open in a side surface of the disc and that extends in a planar direction of the disc, and the shaft may have a gas supply path which extends in a longitudinal direction and through which a gas is supplied to the gas passage. A gas supplied through the gas supply path can be ejected from the opening of the gas passage to the side surface of the disc, thereby preventing deposits from forming on the lower surface of the disc.

A boundary between an outer surface of the shaft of the member for a semiconductor manufacturing apparatus according to the present invention and the surface of the disc with which the shaft is integrated may be a round or tapered surface. This relieves the stress applied to the boundary.

A mold according to the present invention is a mold for use in manufacture of the member for a semiconductor manufacturing apparatus described above, the mold including:
an annular-layer forming space that is a space for forming an annular layer on a shaft side of the disc; and
a shaft forming space that is a space for forming the shaft, the shaft forming space communicating with the annular-layer forming space.

The annular-layer forming space and the shaft forming space of the mold communicate with each other. Thus, when a ceramic slurry containing a ceramic raw material powder and a molding agent is injected into the mold, the ceramic slurry fills both the annular-layer forming space and the shaft forming space. Thereafter, the molding agent is chemically reacted in the mold to mold the ceramic slurry. Thus, a base compact including an unfired annular layer formed by the annular-layer forming space and an unfired shaft formed by the shaft forming space that are integrated together without any joint can be obtained. For example, a disc compact including an electrode (or electrode precursor) is placed on the unfired annular layer of the base compact to obtain a multilayer compact, and the multilayer compact is fired. Thus, a member for a semiconductor manufacturing apparatus can be obtained by firing once.

A boundary between the annular-layer forming space and the shaft forming space of the mold according to the present invention may be a round or tapered surface.

The annular-layer forming space of the mold according to the present invention may be surrounded by a pair of annular surfaces and an outer peripheral surface continuous with the pair of annular surfaces. Of the pair of annular surfaces, an annular surface on a shaft forming space side may be a depressed surface sunken toward the shaft forming space side, and of the pair of annular surfaces, an annular surface on an opposite side from the shaft forming space may be a raised surface projecting toward the shaft forming space side. In this case, the outer edge of the unfired annular layer is raised with respect to the center thereof when the base compact including the unfired annular layer and the unfired shaft that are integrated together without any joint is supported in a position in which the unfired shaft faces downward and the unfired annular layer faces upward. If this base compact is supported in a position in which the unfired shaft faces upward and the unfired annular layer faces downward during firing, the annular layer becomes substantially flat after firing. The depressed surface and the raised surface preferably have a height difference d of from 0.7 mm to 2.6 mm between the central position and a position 150 mm away from the central position radially outward, or have an angle of inclination $\theta$ of $0.25°\leq\theta\leq1°$. In this case, the annular layer becomes flatter after firing. The base compact may be fired after an electrode (or electrode precursor) and a disc compact are placed on the unfired disc lower layer. In this case, the disc lower layer, the electrode, and the disc become flat after firing.

A method for manufacturing a member for a semiconductor manufacturing apparatus according to the present invention includes the steps of:
(a) preparing, by mold casting using the mold described above, a base compact including an unfired annular layer formed by the annular-layer forming space and an unfired shaft formed by the shaft forming space that are integrated together without any joint;
(b) placing a disc compact having an electrode or a precursor thereof on an upper surface of the unfired annular layer to obtain a final compact;
(c) after calcining the final compact, firing the final compact on a horizontal support surface such that a disc side thereof faces downward to obtain a fired casting having no bonding interface; and
(d) forming an electrode exposure hole through which the electrode is exposed in a region, inside the shaft, of a surface of the disc of the fired casting with which the shaft is integrated to obtain a member for a semiconductor manufacturing apparatus.

This method for manufacturing a member for a semiconductor manufacturing apparatus provides a member, for a semiconductor manufacturing apparatus, including a disc and a shaft that are integrated together without any bonding interface. Such a member for a semiconductor manufacturing apparatus can be produced by firing the final compact only once (by applying a thermal history once). This allows for less growth of sintered particles than firing the disc and the shaft twice, thus increasing the strength. Furthermore, the region of the disc inside the shaft is recessed by one step with respect to the region outside the shaft, so that the electrode exposure hole in the region inside the shaft is shallow. Thus, the electrode exposure hole can be more easily formed than a deep electrode exposure hole.

Here, "mold casting" refers to the process of injecting a ceramic slurry containing a ceramic raw material powder and a molding agent into a mold and chemically reacting the molding agent in the mold to mold the ceramic slurry and thereby obtain a casting. The molding agent may be, for example, a material that contains an isocyanate and a polyol and that can be molded by a urethane reaction. "Electrode precursor" refers to a precursor that becomes an electrode after firing, for example, a layer formed by applying or printing an electrode paste in an electrode pattern.

If the pair of annular surfaces forming the annular-layer forming space of the mold used in the method for manufacturing a member for a semiconductor manufacturing apparatus according to the present invention are depressed and raised surfaces as described above, the outer edge of the unfired annular layer is raised with respect to the center thereof when the base compact including the unfired annular layer and the unfired shaft that are integrated together without any joint is supported in a position in which the unfired shaft faces downward and the unfired annular layer faces upward. If the final compact is supported such that the unfired shaft faces upward during firing in the firing step, the disc becomes substantially flat after firing. In mold casting, a gas may be generated by the chemical reaction of the molding agent in the mold. This gas is readily discharged to the outside along the depressed surface. Thus, few bubbles remain in the base compact. In particular, it is preferred that the depressed surface and the raised surface each have a height difference d of from 0.7 mm to 2.6 mm or an angle of inclination $\theta$ of $0.25°\leq\theta\leq1°$ so that the disc becomes flatter after firing.

The disc compact used in step (b) of the method for manufacturing a member for a semiconductor manufacturing apparatus according to the present invention may have a gas passage that is open in a side surface of the disc compact. In this case, a member, for a semiconductor manufacturing apparatus, having a gas passage that is open in the side surface of a disc and that extends in the planar direction of the disc can be obtained.

In step (c) of the method for manufacturing a member for a semiconductor manufacturing apparatus according to the present invention, the calcined final compact may be fired

BRIEF DESCRIPTION OF THE DRAWINGS

FIGS. 5A to 5J are illustrations of a casting step up to the preparation of a final compact 70.

FIGS. 9A to 9D are illustrations of a process of manufacturing a ceramic heater 180.

DETAILED DESCRIPTION OF THE INVENTION

Figure 1:
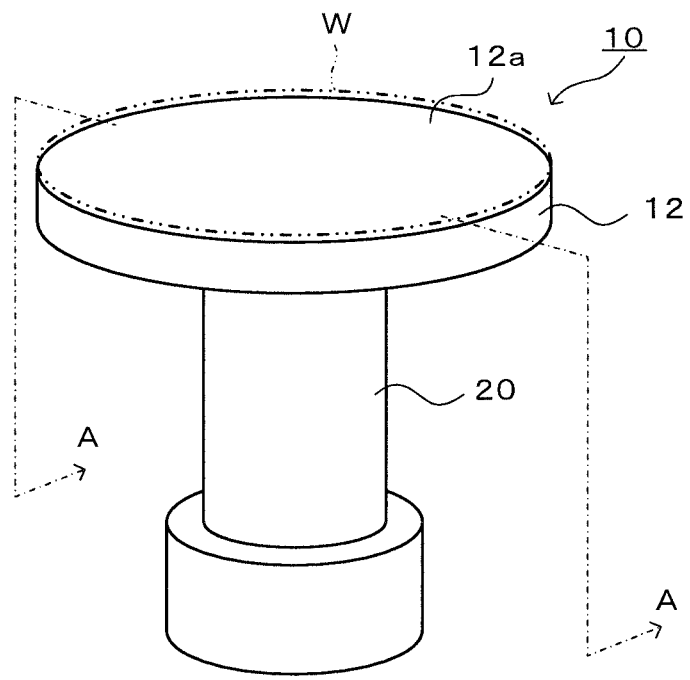
FIG. 1 is a perspective view of a ceramic heater 10.
Figure 2:
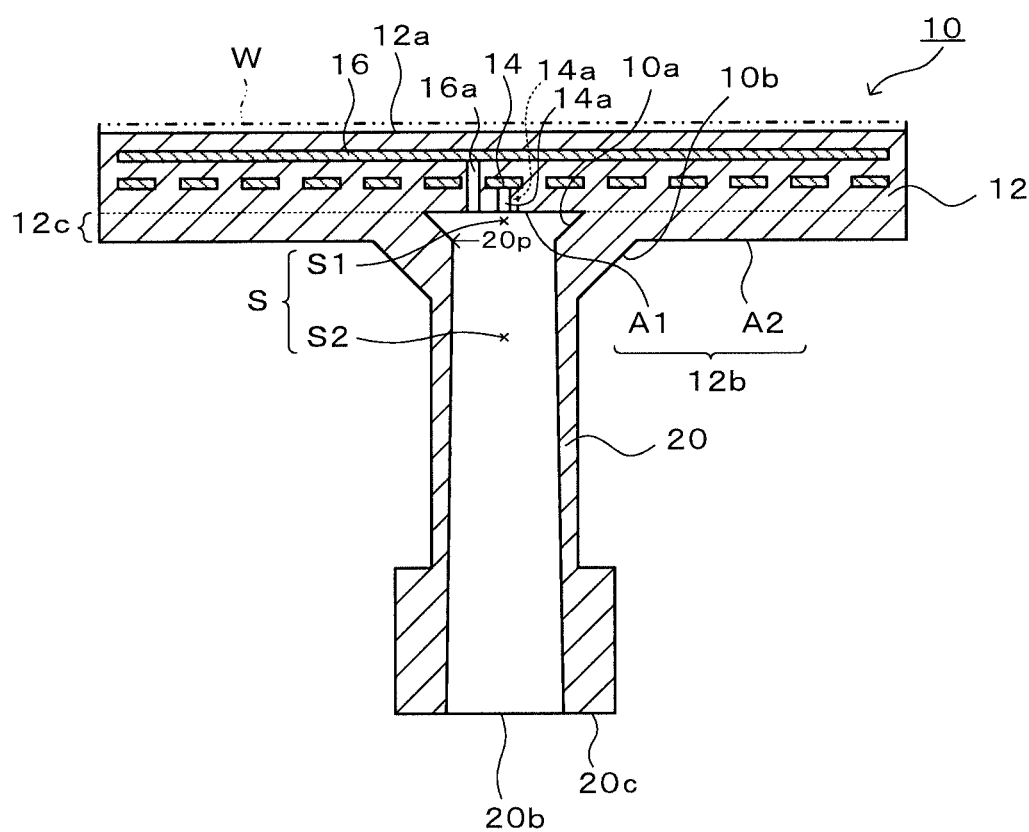
FIG. 2 is a sectional view taken along line A-A of FIG. 1 (longitudinal sectional view).

A preferred embodiment of the present invention will hereinafter be described with reference to the drawings. FIG. 1 is a perspective view of a ceramic heater 10, and FIG. 2 is a sectional view taken along line A-A of FIG. 1. As used in the description of this embodiment, "upper" and "lower" do not indicate absolute positional relationships, but indicate relative positional relationships. "Upper" and "lower" may become "left" and "right", "front" and "rear", or "lower" and "upper", depending on the orientation of the article.

As shown in FIG. 1, the ceramic heater 10 is a type of member for a semiconductor manufacturing apparatus and includes a ceramic disc 12 and a ceramic cylindrical shaft 20. The ceramic heater 10 has no bonding interface. That is, there is no bonding interface in the disc 12, in the shaft 20, or between the disc 12 and the shaft 20.

As shown in FIG. 2, the disc 12 incorporates a heater electrode 14 and a radio-frequency (RF) electrode 16. The upper surface of the disc 12 forms a wafer mounting surface 12a. A silicon wafer W to be subjected to plasma treatment is mounted on the wafer mounting surface 12a. The shaft 20 is integrated with the lower surface 12b of the disc 12 without any bonding interface. The lower surface 12b of the disc 12 has a region A1 inside the shaft 20 and a region A2 outside the shaft 20. The region A1 inside the shaft 20 is recessed by one step with respect to the region A2 outside the shaft 20. The heater electrode 14 and the RF electrode 16 are substantially parallel to the wafer mounting surface 12a. The heater electrode 14 is, for example, a conductive coil made of a single wiring line extending throughout the entire disc 12. Each of both ends of the heater electrode 14 is exposed in the inner space of the shaft 20 through an electrode exposure hole 14a formed in the region A1 inside the shaft 20. Each of both ends of the heater electrode 14 has a power supply rod (not shown) connected thereto via the electrode exposure hole 14a. The heater electrode 14 generates heat when a voltage is applied between both ends of the heater electrode 14 via the power supply rods. The RF electrode 16 is a circular thin-layer electrode having a slightly smaller diameter than the disc 12 and is made of, for example, a sheet of mesh formed by weaving a thin metal wire into a net. This RF electrode 16 is embedded between the heater electrode 14 and the wafer mounting surface 12a of the disc 12. The RF electrode 16 is exposed in the inner space of the shaft 20 through an electrode exposure hole 16a formed in the region A1 inside the shaft 20. The RF electrode 16 has a power supply rod (not shown) connected thereto via the electrode exposure hole 16a. An alternating radio-frequency voltage is applied to the RF electrode 16 via the power supply rod. The heater electrode 14 and the RF electrode 16 are preferably formed of a material having a thermal expansion coefficient close to that of the ceramic material used for the disc 12 to prevent the disc 12 from cracking during manufacture.

The shaft 20 is integrated with the lower surface 12b of the disc 12 without any bonding interface and supports the disc 12. The shaft 20 has an inner space S including a first space S1 extending from a position 20p at a predetermined height with respect to the region A1 of the disc 12 inside the shaft 20 to the region A1 of the disc 12 inside the shaft 20. The first space S1 has a frustoconical shape whose diameter increases gradually from the position 20p at the predetermined height toward the region A1 inside the shaft 20. The inner space S of the shaft 20 also includes a second space S2 extending from the position 20p at the predetermined height to an opening 20b of the shaft 20. The second space S2 has a frustoconical shape whose diameter increases gradually from the position 20p at the predetermined height toward the opening 20b. A wall surface 10a of a peripheral wall surrounding the first space S1 of the ceramic heater 10 and a boundary surface 10b between the outer surface of the shaft 20 and the lower surface 12b of the disc 12 are both tapered surfaces. The two tapered surfaces are substantially parallel to each other.

An example of the use of the ceramic heater 10 will be described next. The ceramic heater 10 is disposed in a chamber (not shown), and a wafer W is mounted on the wafer mounting surface 12a. An alternating radio-frequency voltage is then applied to the RF electrode 16 to generate a plasma between parallel-plate electrodes formed by a counter horizontal electrode (not shown) installed in the upper portion of the chamber and the RF electrode 16 embedded in the disc 12. This plasma is used to perform chemical vapor deposition (CVD) or etching on the wafer W. In addition, the temperature of the wafer W is determined based on a detection signal from a thermocouple (not shown), and the voltage applied to the heater electrode 14 is controlled to adjust that temperature to the set temperature (e.g., 550° C. or 650° C.)

Figure 3:
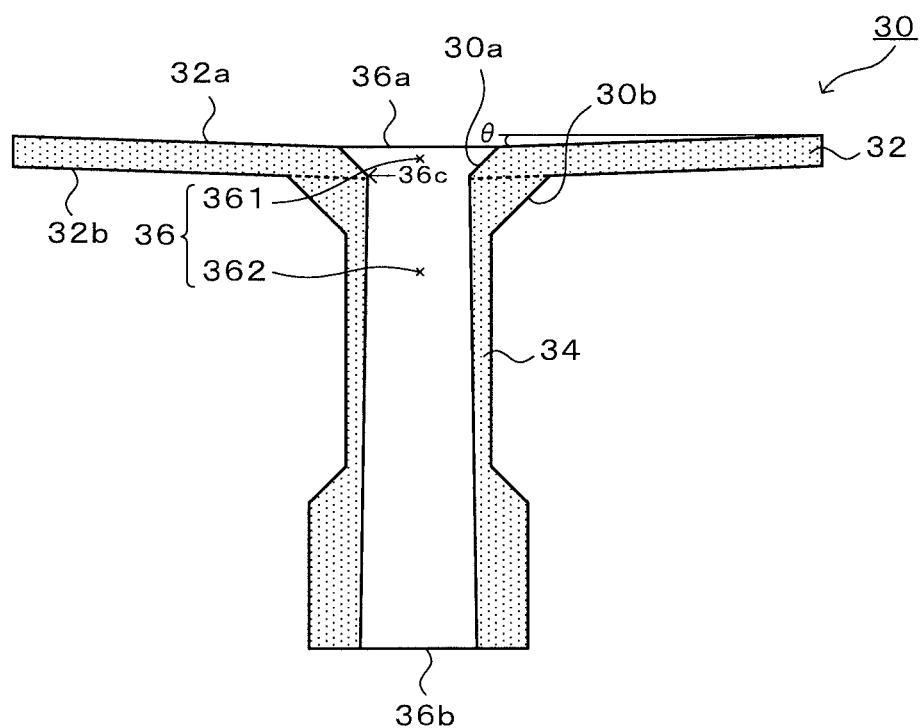
FIG. 3 is a longitudinal sectional view of a base compact 30.
Figure 4:
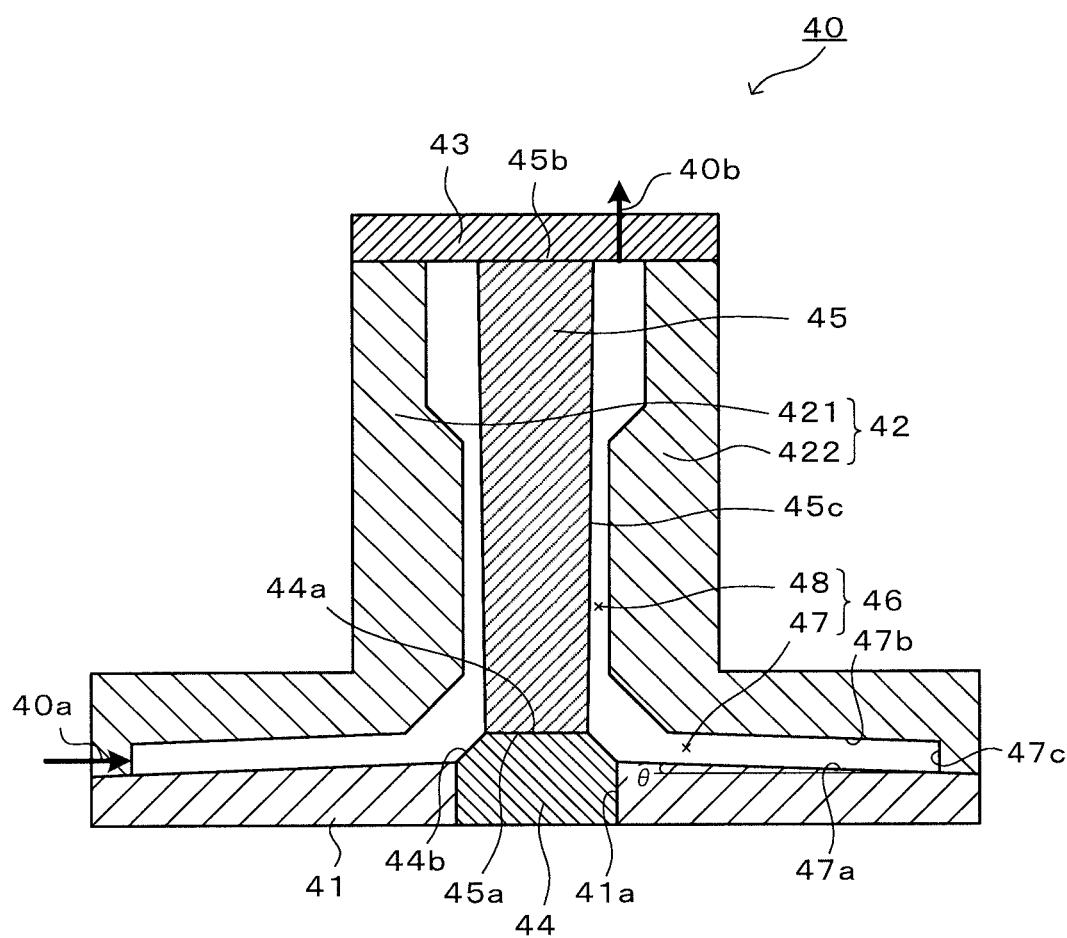
FIG. 4 is a longitudinal sectional view of a mold 40.
Figure 6A:
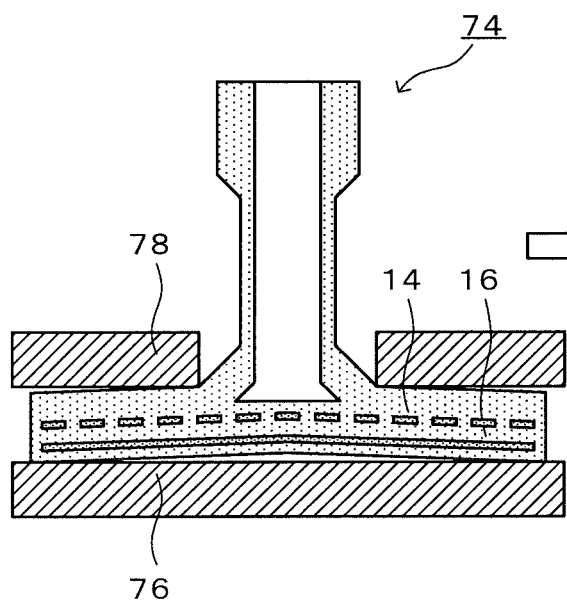
FIGS. 6A and 6B are illustrations of a firing step of firing a calcined casting 74 to obtain a ceramic heater 80.
Figure 6B:
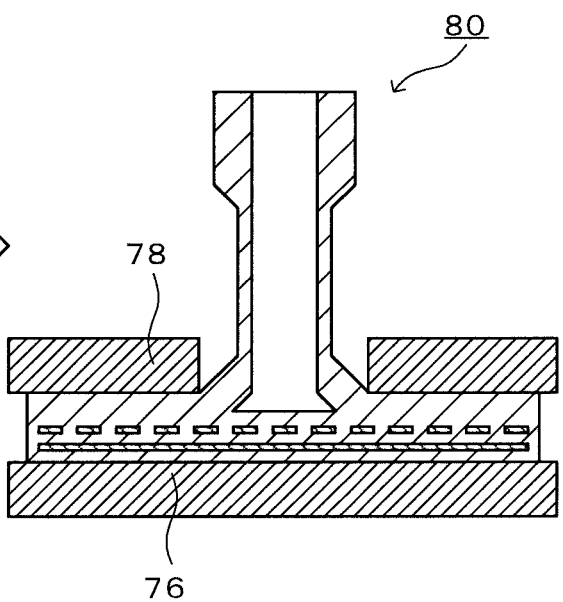

An example of the manufacture of the ceramic heater 10 will be described next. FIG. 3 is a longitudinal sectional view of a base compact 30. FIG. 4 is a longitudinal sectional view of a mold 40. FIGS. 5A to 5J are illustrations of a casting step up to the preparation of a final compact 70. FIGS. 6A and 6B are illustrations of a firing step of firing a calcined casting 74 to obtain a ceramic heater 80.

1. Casting Step

The base compact 30 used for manufacture of the ceramic heater 10 is first prepared. As shown in FIG. 3, the base compact 30 includes an unfired annular layer 32 and an unfired shaft 34 that are integrally formed without any joint. The unfired annular layer 32 is a casting corresponding to an annular layer 12c (see FIG. 2) on the shaft side of a plane containing the region A1 of the lower surface 12b of the disc 12 inside the shaft 20, whereas the unfired shaft 34 is a casting corresponding to the shaft 20. The outer edge of the unfired annular layer 32 is raised with respect to the center thereof. Specifically, a surface 32a (upper surface) of the unfired annular layer 32 is a depressed surface sunken toward the unfired shaft 34 so as to have a frustoconical shape, whereas a surface 32b (lower surface) of the unfired annular layer 32 is a raised surface projecting toward the unfired shaft 34. The two surfaces 32a and 32b are parallel to each other. Each of the two surfaces 32a and 32b of the unfired annular layer 32 preferably has a height difference d of from 0.7 mm to 2.6 mm between the central position and a position 150 mm away from the central position radially outward or has a predetermined angle of inclination θ of from 0.25° to 1° between a line segment connecting the center to the outer edge and a horizontal plane. An unfired disc compact 50, described later, is bonded to the surface 32a of the unfired annular layer 32 with an organic adhesive.

The base compact 30 has a through-hole 36 extending therethrough along the central axis in the longitudinal direction. The through-hole 36 corresponds to the inner space S of the ceramic heater 10. The through-hole 36 includes a first tapered hole 361 extending from an intermediate position 36c to an opening 36a on the unfired annular layer side. The diameter of the first tapered hole 361 increases gradually from the intermediate position 36c toward the opening 36a. The through-hole 36 also includes a second tapered hole 362 extending from the intermediate position 36c to an opening 36b on the unfired shaft side. The diameter of the second tapered hole 362 increases gradually from the intermediate position 36c toward the opening 36b. The first and second tapered holes 361 and 362 of the base compact 30 correspond to the first and second spaces S1 and S2, respectively, of the ceramic heater 10. The intermediate position 36c corresponds to the position 20p of the ceramic heater 10. A wall surface 30a of a peripheral wall surrounding the first tapered hole 361 of the base compact 30 and a boundary surface 30b between the outer surface of the unfired shaft 34 and the surface 32b of the unfired annular layer 32 are both tapered surfaces. The two tapered surfaces are substantially parallel to each other. The wall surface 30a corresponds to the wall surface 10a of the ceramic heater 10, whereas the boundary surface 30b corresponds to the boundary surface 10b of the ceramic heater 10.

To prepare the base compact 30, a mold 40 for forming the base compact 30 is provided. As shown in FIG. 4, the mold 40 is composed of a large disc portion 41, a main body 42, a small disc portion 43, a first core rod 44, and a second core rod 45. The inner space 46 of the mold 40 is a space having the same shape as the base compact 30 and is composed of an annular-layer forming space 47 and a shaft forming space 48. The large disc portion 41, the main body 42, and the small disc portion 43 define the outer surface of the base compact 30. The large disc portion 41 is a portion that defines the surface 32a of the unfired annular layer 32 and has a through-hole 41a in the center thereof. The main body 42 is a portion that mainly defines the outer peripheral surface, the surface 32b, and the side surface of the unfired shaft 34 of the base compact 30 and is separable into a pair of left and right segments 421 and 422. The small disc portion 43 is a portion that defines the end surface of the unfired shaft 34 of the base compact 30. The first core rod 44 is a cylindrical member inserted into the through-hole 41a of the large disc portion 41 and is chamfered at the outer edge of an end surface 44a disposed inside the mold 40 to form a tapered surface 44b. The tapered surface 44b forms the wall surface 30a of the base compact 30. The second core rod 45 is a cylindrical member inserted into the inner space of the main body 42 along the central axis of the main body 42 and has one end surface 45a in contact with the end surface 44a of the first core rod 44 and the other end surface 45b in contact with the small disc portion 43. The side surface of the second core rod 45 is a tapered surface 45c whose diameter increases gradually from the end surface 45a toward the other end surface 45b. The tapered surface 45c forms the wall surface surrounding the second tapered hole 362 of the base compact 30. The position of the surfaces of the first core rod 44 and the second core rod 45 in contact with each other corresponds to the intermediate position 36c of the base compact 30.

The annular-layer forming space 47 is a space for forming the unfired annular layer 32. This annular-layer forming space 47 is a space surrounded by a pair of annular surfaces 47a and 47b, an outer peripheral surface 47c continuous with the pair of annular surfaces 47a and 47b, and the tapered surface 44b of the first core rod 44. Of the pair of annular surfaces 47a and 47b, the annular surface 47a on the opposite side from the shaft forming space 48 is a raised surface projecting toward the shaft forming space side, whereas the annular surface 47b on the shaft forming space side is a depressed surface sunken toward the shaft forming space side. The annular surfaces 47a and 47b form the surfaces 32a and 32b, respectively, of the base compact 30. The annular surfaces 47a and 47b preferably have a height difference d of from 0.7 mm to 2.6 mm between the central position and a position 150 mm away from the central position radially outward. The annular surfaces 47a and 47b also preferably have an angle of inclination θ of $0.25° \leq θ \leq 1°$. Table 1 below shows an example relationship between the angle of inclination θ and the height difference d. The mold 40 has a slurry inlet 40a formed in the outer peripheral surface of the annular-layer forming space 47 and an outlet 40b formed in the small disc portion 43.

TABLE 1

| θ (°) | tan θ | d* (mm) |
|---|---|---|
| 0.25 | 0.004 | 0.7 |
| 1 | 0.017 | 2.6 |

*d is a height difference between a central position of a circular surface and a position 150 mm away from the central position radially outward.

As shown in FIG. 5A, a ceramic slurry is injected into the inlet 40a of the mold 40 to fill the entire inner space 46 of the mold 40 while discharging air from the outlet 40b, and the slurry is cured to obtain the base compact 30. A specific procedure is as follows.

A dispersion medium and a dispersant are added to a ceramic powder, and they are mixed to prepare a ceramic slurry precursor. The ceramic material used as the ceramic powder may be either an oxide-based ceramic or a non-oxide-based ceramic. Examples of ceramic materials that can be used include alumina, yttria, aluminum nitride, silicon nitride, silicon carbide, samaria, magnesia, magnesium fluoride, and ytterbium oxide. These materials can be used alone or in combination. The ceramic material may have any particle size as long as the slurry can be adjusted and prepared. The dispersion medium may be any material capable of dissolving the dispersant, an isocyanate, a polyol, and a catalyst. Examples of dispersion media can include hydrocarbon dispersion media (e.g., toluene, xylene, and solvent naphtha), ether dispersion media (e.g., ethylene glycol monoethyl ether, butyl carbitol, and butyl carbitol acetate), alcohol dispersion media (e.g., isopropanol, 1-buthanol, ethanol, 2-ethylhexanol, terpineol, ethylene glycol, and glycerol), ketone dispersion media (e.g., acetone and methyl ethyl ketone), esters (butyl acetate, dimethyl glutarate, and triacetin), and polybasic acid dispersion media (e.g., glutaric acid). Particularly preferred are solvents having two or more ester linkages, such as polybasic acid esters (e.g., dimethyl glutarate) and acid esters of polyhydric alcohols (e.g., triacetin). The dispersant may be, for example, any material capable of uniformly dispersing the ceramic powder in the dispersion medium. Examples of dispersants can include polycarboxylic acid-based copolymers, polycarboxylic acid salts, sorbitan fatty acid esters, polyglycerol fatty acid esters, phosphate salt-based copolymers, sulfonic acid salt-based copolymers, and polyurethane polyester-based copolymers having tertiary amines. Particularly preferred are polycarboxylic acid-based copolymers and polycarboxylic acid salts. The addition of such a dispersion medium allows the slurry before casting to have low viscosity and high flowability. In this way, the dispersion medium and the dispersant are added to the ceramic powder in predetermined proportions, and they are mixed and disintegrated over a predetermined period of time to prepare a ceramic slurry precursor.

A molding agent (isocyanate and polyol) and a catalyst are then added to the ceramic slurry precursor, and they are mixed and vacuum-degassed to prepare a ceramic slurry. The isocyanate may be any substance having an isocyanate functional group. Examples of isocyanates that can be used include hexamethylene diisocyanate (HDI), tolylene diisocyanate (TDI), diphenylmethane diisocyanate (MDI), and modified derivatives thereof. The isocyanate may have reactive functional groups other than isocyanate groups in the molecule thereof. Like polyisocyanates, the isocyanate may have a large number of reactive functional groups. The polyol may be any substance having a functional group capable of reacting with an isocyanate group, such as a hydroxyl group or an amino group. Examples of polyols that can be used include ethylene glycol (EG), polyethylene glycol (PEG), propylene glycol (PG), polypropylene glycol (PPG), polytetramethylene glycol (PTMG), polyhexamethylene glycol (PHMG), and polyvinyl butyral (PVB). The catalyst may be any substance capable of facilitating urethane reactions. Examples of catalysts that can be used include triethylenediamine, hexanediamine, 6-dimethylamino-1-hexanol, 1,5-diazabicyclo[4.3.0]nonene-5, 1,8-diazabicyclo[5.4.0]-7-undecene, dimethylbenzylamine, and hexamethyltetraethylenetetramine. The ceramic slurry is injected into the inlet 40a of the mold 40 to fill the annular-layer forming space 47 and the shaft forming space 48. Thereafter, the isocyanate and the polyol are chemically reacted to form a urethane resin serving as an organic binder (urethane reaction), and adjacent urethane resin molecules are then crosslinked by linking together urethane groups (—O—CO—NH—) formed in those molecules to cure the ceramic slurry. The urethane resin functions as an organic binder. Thus, the base compact 30 is prepared inside the mold 40.

The ceramic slurry precursor and the ceramic slurry may be prepared by any mixing process. For example, ball mills, planetary mixers, vibration mixers, propeller mixers, and static mixers can be used. The size of the base compact 30 is determined by taking into account the size of the ceramic heater 10 and the shrinkage after firing. A gas may be generated by the chemical reaction of the molding agent in the mold 40. This gas is readily discharged to the outside along the annular surfaces 47a and 47b having the angle of inclination θ (see FIG. 4). Thus, no bubbles remain in the base compact 30.

The small disc portion 43 of the mold 40 and the pair of left and right segments 421 and 422 of the main body 42 are then detached to expose the base compact 30 (see FIG. 5B). The first core rod 44 is then withdrawn downward from the through-hole 41a of the large disc portion 41 and the first tapered hole 361 of the base compact 30, whereas the second core rod 45 is withdrawn upward from the second tapered hole 362 of the base compact 30. Because the first core rod 44 has the tapered surface 44b, the first core rod 44 can be easily withdrawn from the first tapered hole 361 of the base compact 30. Because the second core rod 45 also has the tapered surface 45c, the second core rod 45 can be easily withdrawn from the second tapered hole 362 of the base compact 30. In this way, the base compact 30 is removed from the mold 40 (see FIG. 5C).

On the other hand, a mold 60 for forming a disc compact 50 is separately provided. As shown in FIG. 5I, the disc compact 50 incorporates the heater electrode 14 and the RF electrode 16 and is integrally formed without any joint. The disc compact 50 has an overall shape whose outer edge is raised with respect to the center thereof. The surface 50a (upper surface) and the surface 50b (lower surface) of the disc compact 50 are parallel to the surface 32a of the base compact 30.

As shown in FIG. 5D, the mold 60 is composed of a first upper mold section 61 and a lower mold section 64. The two mold sections 61 and 64 define a space for forming an unfired disc lower layer 51 whose outer edge is raised with respect to the center thereof. The lower mold section 64 is a cup-shaped mold section whose bottom surface is a depressed surface sunken in the center thereof. This depressed surface matches the shape of the surface 50b of the disc compact 50. The lower surface of the first upper mold section 61 is shaped to form a heater electrode groove 51a into which the heater electrode 14 is to be fitted in the unfired disc lower layer 51. The space between the two mold sections 61 and 64 is filled with a ceramic slurry similar to that described above, and the ceramic slurry is cured by a chemical reaction to form the unfired disc lower layer 51.

The first upper mold section 61 is then detached to expose the upper surface of the unfired disc lower layer 51, and the coil-like heater electrode 14 is fitted into the heater electrode groove 51a (see FIG. 5E). A second upper mold section 62 is then attached to the lower mold section 64 to form a space above the unfired disc lower layer 51. This space is filled with a ceramic slurry similar to that described above, and the ceramic slurry is cured by a chemical reaction to form an unfired disc middle layer 52 (see FIG. 5F). A circular RF electrode groove 52a is formed in the upper surface of the unfired disc middle layer 52. The second upper mold section 62 is then detached to expose the upper surface of the unfired disc middle layer 52, and the mesh-like RF electrode 16 is fitted into the RF electrode groove 52a (see FIG. 5G). A third upper mold section 63 is then attached to the lower mold section 64 to form a space above the unfired disc middle layer 52. This space is filled with a ceramic slurry similar to that described above, and the ceramic slurry is cured by a chemical reaction to form an unfired disc upper layer 53 (see FIG. 5H). Thus, the disc compact 50 is formed. The third upper mold section 63 is then detached, and the disc compact 50 is removed from the lower mold section 64 (see FIG. 5I). An organic adhesive 72 is then applied to the surface 32a of the base compact 30, and the disc compact 50 is placed thereon such that the surface 50b of the disc compact 50 comes into contact therewith, thereby integrating the base compact 30 with the disc compact 50. In this way, the final compact 70 is obtained (see FIG. 5J). A portion of the final compact 70 including the disc compact 50 and the unfired annular layer 32 of the base compact 30 is referred to as "unfired disc 54". The unfired disc 54 is a member corresponding to the disc 12 of the ceramic heater 10. The final compact 70 includes the unfired disc 54 and the unfired shaft 34 that are integrated together. The outer edge of the unfired disc 54 of the final compact 70 is raised with respect to the center thereof. The unfired disc 54 preferably has a height difference d of from 0.7 mm to 2.6 mm between the central position and a position 150 mm away from the central position radially outward. The unfired disc 54 also preferably has an angle of inclination of from 0.25° to 1°.

2. Drying, Debinding, and Calcining Steps (1) Drying

The dispersion medium is evaporated from the final compact 70. The drying temperature and the drying time may be set as appropriate depending on the type of dispersion medium used. However, too high drying temperatures are not preferred since such temperatures can result in cracking. The atmosphere may be air, an inert atmosphere, a vacuum, or a hydrogen atmosphere.

(2) Debinding

After the dispersion medium is evaporated, the organic adhesive, binder, dispersant, and catalyst present in the final compact 70 are decomposed. The decomposition temperature may be, for example, 400° C. to 600° C. Although the atmosphere may be air, an inert atmosphere, a vacuum, or a hydrogen atmosphere, an inert atmosphere or a vacuum is employed if an electrode is embedded or if a non-oxide-based ceramic is used.

(3) Calcination

After debinding, the final compact 70 is heat-treated (calcined) at 750° C. to 1,300° C. to obtain a calcined casting 74 (see FIG. 6A). Calcination is intended to increase the strength for improved handleability. Although the atmosphere may be air, an inert atmosphere, a vacuum, or a hydrogen atmosphere, an inert atmosphere or a vacuum is employed if an electrode is embedded or if a non-oxide-based ceramic is used. The calcined casting 74 has the same shape as the final compact 70. Debinding and calcination may be simultaneously performed after drying.

3. Firing Step

The calcined casting 74 is fired in a position in which the disc faces downward and the shaft faces upward to obtain a ceramic heater 80. The maximum temperature during firing is set as appropriate depending on the type of powder and particle size of the powder, preferably within the range of 1,000° C. to 2,000° C. The disc portion of the calcined casting 74, whose outer edge is raised with respect to the center thereof, becomes substantially flat after firing. The atmosphere may be air, an inert atmosphere, or a vacuum. To further reduce deformation during firing so that the disc portion becomes flatter, as shown in FIG. 6A, the calcined casting 74 is preferably placed on a flat horizontal support plate 76 (e.g., a boron nitride (BN) plate) such that the disc portion faces downward and the shaft portion faces upward and is fired at atmospheric pressure under a load applied by a doughnut-shaped weight 78 placed on the disc portion. In this way, a ceramic heater 80 having no bonding interface is obtained (see FIG. 6B). If the weight 78 is too heavy, cracking may occur due to the difference in shrinkage between the disc portion under load and the free shaft portion. Accordingly, the weight 78 is preferably set as appropriate within the range of 5 to 10 kg. The weight 78 is preferably separable into two or more segments along the diameter for ease of attachment and detachment.

4. Hole Formation Step

The electrode exposure holes 14a and 16a are formed at predetermined positions in the region inside the shaft 20 of the ceramic heater 80, for example, with a drill. The shape of a flange formed around the opening 20b of the shaft 20 is trimmed by grinding. Thus, the ceramic heater 10 is finished.

The ceramic heater 10 according to this embodiment described in detail above has no bonding interface and thus suffers no bonding interface separation. In addition, the ceramic heater 10 can be produced by firing the final compact 70 including the disc and the shaft that are integrated together only once (by applying a thermal history once). This allows for less growth of sintered particles than applying a thermal history twice, thus increasing the strength. Furthermore, the region A1 of the lower surface 12b of the disc 12 inside the shaft 20 is recessed by one step with respect to the region A2 outside the shaft 20, so that the electrode exposure holes 14a and 16a in the region A1 inside the shaft 20 are shallow. Thus, the electrode exposure holes 14a and 16a can be more easily formed than deep electrode exposure holes.

In addition, the first space S1 of the inner space S of the shaft 20 has a frustoconical shape whose diameter increases from the position 20p at the predetermined height with respect to the region A1 of the disc 12 inside the shaft 20 toward the region A1 of the disc 12 inside the shaft 20. In this case, when the ceramic heater 10 is manufactured by the method of manufacture described above, the base compact 30 has the first tapered hole 361 whose diameter increases toward the opening 36a. Thus, after the formation of the base compact 30 with the mold 40, the first core rod 44 can be smoothly withdrawn from the first tapered hole 361.

In addition, the second space S2 of the inner space S of the shaft 20 has a frustoconical shape whose diameter increases from the position 20p at the predetermined height toward the opening 20b of the shaft 20. In this case, when the ceramic heater 10 is manufactured by the method of manufacture described above, the base compact 30 has the second tapered hole 362 whose diameter increases toward the opening 36b. Thus, after the formation of the base compact 30 with the mold 40, the second core rod 45 can be smoothly withdrawn from the second tapered hole 362.

In addition, the boundary surface 10b between the outer surface of the shaft 20 and the lower surface 12b of the disc 12 is a tapered surface, which relieves the stress applied to the boundary surface 10b.

In addition, the annular-layer forming space 47 and the shaft forming space 48 of the mold 40 communicate with each other. Thus, the base compact 30 including the unfired annular layer 32 and the unfired shaft 34 that are integrated together without any joint can be obtained by injecting the ceramic slurry into the mold 40 and chemically reacting the molding agent in the mold 40 to mold the slurry. The disc compact 50 is placed on the unfired annular layer 32 of the base compact 30 to obtain the final compact 70 before calcination and firing. Thus, the ceramic heater 10 can be obtained by firing once.

In addition, the ceramic heater 10 having no bonding interface can be easily obtained by the method for manufacturing the ceramic heater 10 described above. In particular, the pair of annular surfaces 47a and 47b forming the annular-layer forming space 47 of the mold 40 are raised and depressed surfaces as described above. Thus, the outer edge of the unfired annular layer 32 is raised with respect to the center thereof when the base compact 30 including the unfired annular layer 32 and the unfired shaft 34 that are integrated together without any joint is supported in a position in which the unfired shaft 34 faces downward and the unfired annular layer 32 faces upward. If the calcined casting 74 is supported such that the shaft portion faces upward during firing in the firing step, the disc 12 becomes substantially flat after firing. In mold casting, a gas may be generated by the chemical reaction of the molding agent in the mold 40. This gas is readily discharged to the outside along the depressed surface. Thus, few bubbles remain in the final compact 70. In particular, if the depressed surface and the raised surface each have a height difference d of from 0.7 mm to 2.6 mm or an angle of inclination θ of $0.25°≤θ≤1°$, the disc lower layer becomes flatter after firing.

In addition, the calcined casting 74 is fired at atmospheric pressure in the firing step with the weight 78 placed on the disc portion. Thus, the disc 12 becomes flatter and less deformed.

It should be understood that the present invention is not limited to the embodiment described above in any way, but can be practiced in various embodiments that fall within the technical scope of the invention.

Figure 7:
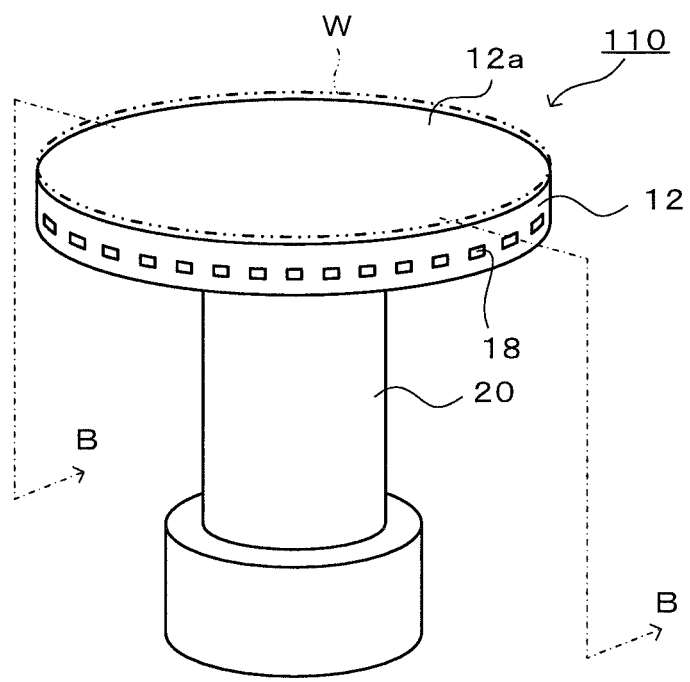
FIG. 7 is a perspective view of a ceramic heater 110.
Figure 8:
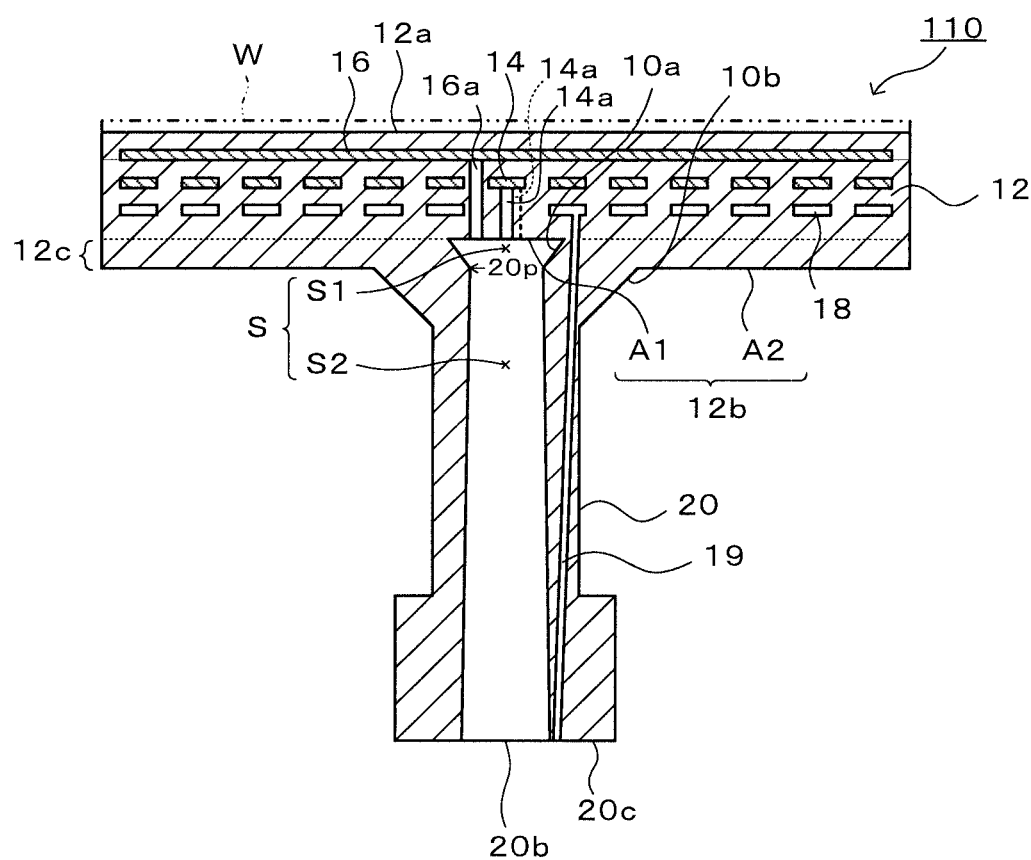
FIG. 8 is a sectional view taken along line B-B of FIG. 7.

For example, as shown in FIGS. 7 and 8, the ceramic heater 10 according to the embodiment described above may have gas passages 18 under the heater electrode 14. The ceramic heater 10 having the gas passages 18 is referred to as "ceramic heater 110". FIG. 7 is a perspective view of the ceramic heater 110, and FIG. 8 is a sectional view taken along line B-B of FIG. 7. In FIG. 8, the same components as those of the embodiment described above are denoted by the same reference numerals. The gas passages 18 are passages extending in the planar direction parallel to the wafer mounting surface 12a of the disc 12 and are open in the side surface of the ceramic heater 110. The shaft 20 has, in the peripheral wall thereof, a gas supply path 19 which extends in the longitudinal direction and through which a gas is supplied to the gas passages 18. This gas supply path 19 extends in a straight line from the lower end surface 20c of the shaft 20 to the gas passages 18. Accordingly, for example, the thickness of the peripheral wall of the shaft 20, the taper angles of the wall surface 10a and the boundary surface 10b, and the distance between the wall surface 10a and the boundary surface 10b are designed to allow the gas supply path 19 to extend in a straight line from the lower end surface 20c of the shaft 20 to the gas passages 18. When a plasma is used to perform CVD or etching on the wafer W mounted on the wafer mounting surface 12a of the ceramic heater 110, a gas supplied through the gas supply path 19 can be ejected from the openings of the gas passages 18 to the side surface of the disc 12, thereby preventing deposits from forming on the lower surface of the disc 12.

To manufacture the ceramic heater 110, a base compact 130 and a disc compact 150 shown in FIG. 9A are first prepared. The base compact 130 has the same configuration as the base compact 30 except that the base compact 130 has a cavity 19a forming part of the gas supply path 19. The mold used for preparation of the base compact 130 is identical to the mold 40 except that a core rod member for forming the cavity 19a is added. Alternatively, the cavity 19a may be formed after the preparation of the base compact 130 to obtain the base compact 130. The disc compact 150 has the heater electrode 14, the RF electrode 16, and the gas passages 18 embedded therein and can be prepared as shown in FIGS. 5(d) to 5(i). The disc compact 150 has a cavity 19b forming part of the gas supply path 19 under the gas passages 18. The cavity 19b may be formed using the mold or may be formed after casting. As shown in FIG. 9B, an organic adhesive is printed on the upper surface of the base compact 130, and the disc compact 150 is bonded thereto. Thus, a final compact 170 is obtained. As in the embodiment described above, the final compact 170 is dried, debinded, and calcined to obtain a calcined casting 174, and the calcined casting 174 is then fired to obtain a ceramic heater 180 (having no electrode exposure hole). For example, as shown in FIG. 9C, the calcined casting 174 may be placed on a flat horizontal support plate 76 (e.g., a BN plate) such that the disc portion faces downward and the shaft portion faces upward and may be fired at atmospheric pressure under a load applied by a doughnut-shaped weight 78 placed on the disc portion to obtain the ceramic heater 180. Finally, the electrode exposure holes 14a and 16a are formed, for example, with a drill, and the shape of a flange formed around the opening of the shaft is trimmed by grinding to obtain the ceramic heater 110. This ceramic heater 110 has no bonding interface and thus suffers no bonding interface separation. In addition, the ceramic heater 110 can be produced by firing the calcined casting 174 only once (by applying a thermal history once). This allows for less growth of sintered particles than applying a thermal history twice to the disc 12 and the shaft 20, thus increasing the strength. Furthermore, the region A1 of the disc 12 inside the shaft 20 is recessed by one step with respect to the region A2 outside the shaft 20, so that the electrode exposure holes 14a and 16a in the region A1 inside the shaft 20 are shallow. Thus, the electrode exposure holes 14a and 16a can be more easily formed than deep electrode exposure holes.

Although an example in which both the heater electrode 14 and the RF electrode 16 are incorporated into the disc 12 has been shown in the embodiment described above, only one of them may be incorporated into the disc 12. Instead of or in addition to these electrodes 14 and 16, an electrostatic electrode for attracting and holding the wafer W onto the wafer mounting surface 12a by electrostatic force may be incorporated into the disc 12. This also applies to the ceramic heater 110.

In the embodiment described above, the annular surface 47a of the mold 40 is a raised surface projecting so as to have a frustoconical shape, whereas the annular surface 47b is a depressed surface sunken so as to have a frustoconical shape; however, the annular surface 47a may be a raised surface having a curved shape, whereas the annular surface 47b may be a depressed surface having a curved shape.

In the embodiment described above, the coil-like heater electrode 14 is fitted into the heater electrode groove 51a, whereas the mesh-shaped RF electrode 16 is fitted into the RF electrode groove 52a; however, instead of forming such grooves 51a and 52a, an electrode pattern may be formed using an electrode paste, for example, by screen printing. The electrode pattern may be formed on the surface of the casting. Alternatively, the electrode pattern may be provided in advance on the inner surface of the mold before the preparation of the casting and may then be attached to the casting during the preparation of the casting. The electrode paste is prepared so as to contain, for example, a conductive material, a ceramic material, a binder, a dispersion medium, and a dispersant. Examples of conductive materials can include tungsten, tungsten carbide, platinum, silver, palladium, nickel, molybdenum, ruthenium, aluminum, and compounds thereof. Examples of binders that can be used include polyethylene glycol (PEG), propylene glycol (PG), polypropylene glycol (PPG), polytetramethylene glycol (PTMG), polyhexamethylene glycol (PHMG), polyvinyl butyral (PVB), and acrylic resins. The dispersion medium and the dispersant used may be similar to those used for the molding agent.

Although the upper and lower surfaces of the unfired annular layer 32 of the base compact 30 both have an angle of inclination θ of from 0.25° to 1° in the embodiment described above, the angle of inclination θ may be an angle outside this range (e.g., 0° or 2°). In this case, the wafer mounting surface 12a of the resulting ceramic heater 10 is not as flat as that of the embodiment described above; however, the ceramic heater 10 suffers no bonding interface separation because the disc 12 and the shaft 20 are integrated together without any bonding interface. In addition, in this case, the ceramic heater 10 can be produced by applying a thermal history once to the calcined casting, which allows for less growth of sintered particles than applying a thermal history twice to the disc 12 and the shaft 20, thus increasing the strength. This also applies to the ceramic heater 110.

Figure 10:
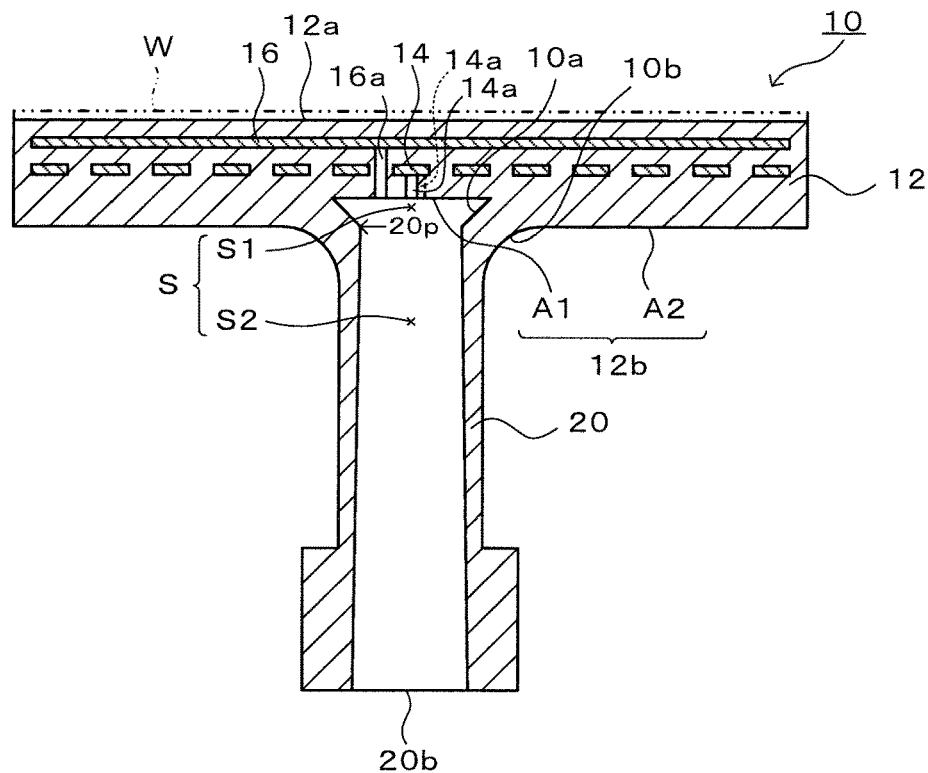
FIG. 10 is a longitudinal sectional view of a modification of the ceramic heater 10.
Figure 11:
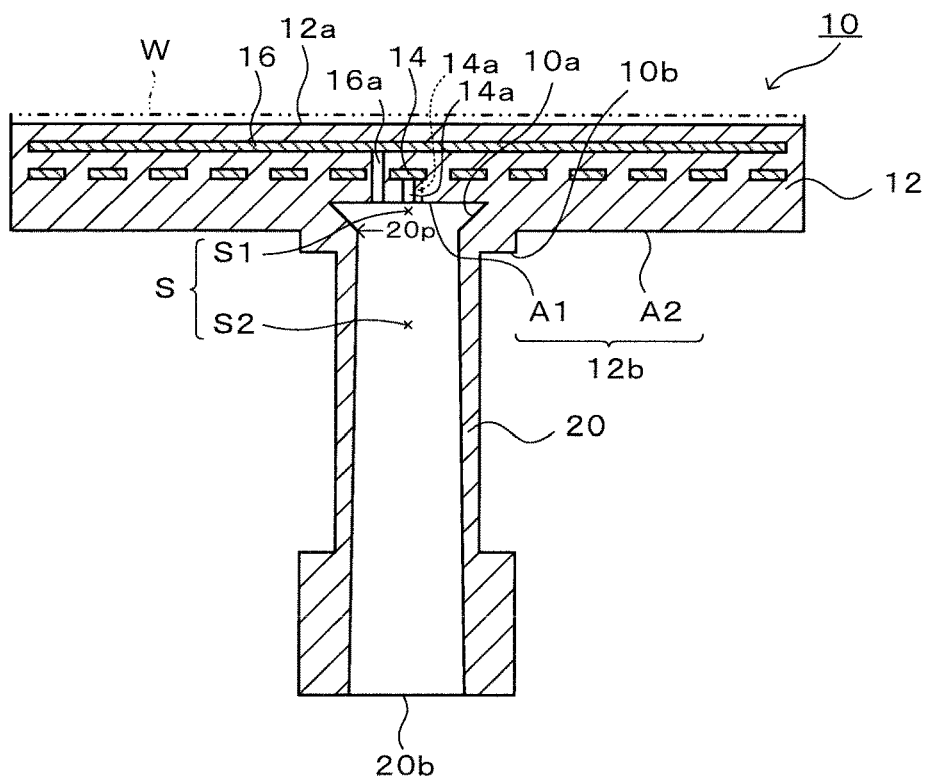
FIG. 11 is a longitudinal sectional view of a modification of the ceramic heater 10.
Figure 12:
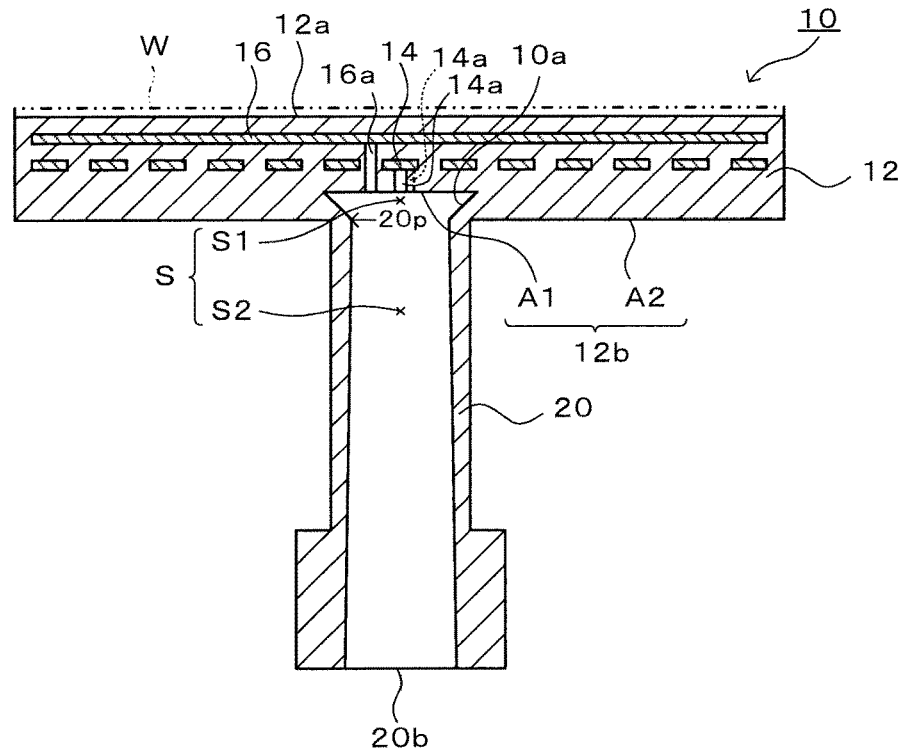
FIG. 12 is a longitudinal sectional view of a modification of the ceramic heater 10.

Although the boundary surface 10b between the outer surface of the shaft 20 and the lower surface 12b of the disc 12 of the ceramic heater 10 is a tapered surface in the embodiment described above, the boundary surface 10b is not limited to a tapered surface. For example, as shown in FIG. 10, the boundary surface 10b may be a round surface having a predetermined radius of curvature. Alternatively, as shown in FIG. 11, the boundary surface 10b may be a stepped surface (which looks like the flange of the shaft 20). Alternatively, as shown in FIG. 12, the outer surface of the shaft 20 and the lower surface 12b of the disc 12 may be substantially orthogonal to each other. Such surfaces can be obtained by grinding the tapered boundary surface 10b in the embodiment described above. In FIGS. 10 to 12, the same components as those of the embodiment described above are denoted by the same reference numerals.

Figure 13:
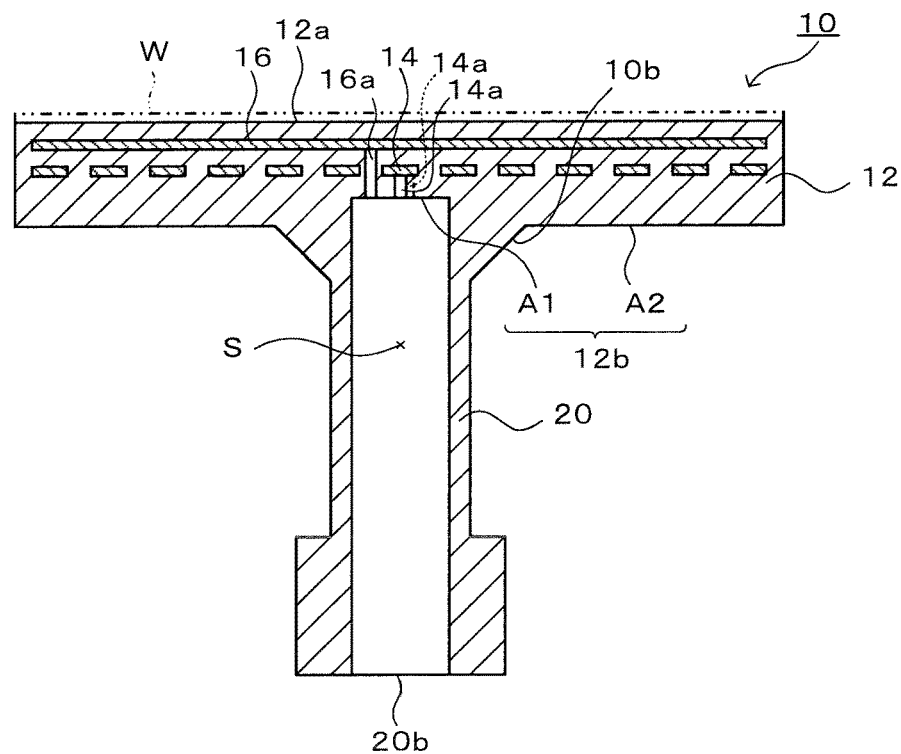
FIG. 13 is a longitudinal sectional view of a modification of the ceramic heater 10.

The inner space S of the ceramic heater 10 includes the first and second frustoconical spaces S1 and S2 in the embodiment described above; however, as shown in FIG. 13, the inner space S may be a cylindrical space having a straight shape. In FIG. 13, the same components as those of the embodiment described above are denoted by the same reference numerals. The boundary surface 10b in FIG. 13 may be changed as shown in FIGS. 10 to 12.

EXAMPLES

Of Experimental Examples 1 to 3 described below, Experimental Examples 1 and 2 are examples of the present invention, whereas Experimental Example 3 is a comparative example. In Experimental Examples 1 and 2, ceramic heaters 10 were produced. The following experimental examples are not intended to limit the invention in any way.

Experimental Example 1

1. Casting Step

A ceramic slurry precursor was first prepared by mixing together 100 parts by mass of aluminum nitride powder (purity: 99.7%), 5 parts by mass of yttrium oxide, 2 parts by mass of a dispersant (polycarboxylic acid-based copolymer), and 30 parts by mass of a dispersion medium (polybasic acid ester) in a ball mill (trommel) for 14 hours. To this ceramic slurry precursor, 4.5 parts by mass of an isocyanate (4,4'-diphenylmethane diisocyanate), 0.1 parts by mass of water, and 0.4 parts by mass of a catalyst (6-dimethylamino-1-hexanol) were added and mixed to obtain a ceramic slurry. This ceramic slurry was used to prepare a final compact 70 by the procedure shown in FIGS. 5A to 5J. The mold 40 had an angle of inclination θ of 0.5°. The circular surfaces of the mold 40 had a height difference d of 1.3 mm between the central position and a position 150 mm away from the central position radially outward. The heater electrode 14 used was a molybdenum (Mo) coil, whereas the RF electrode 16 used was a Mo mesh.

2. Drying, Debinding, and Calcining Steps

The resulting final compact 70 was dried at 100° C. for 10 hours, was debinded at a maximum temperature of 500° C., and was calcined at a maximum temperature of 820° C. in a nitrogen atmosphere to obtain a calcined casting 74.

3. Firing Step

As shown in FIGS. 6A and 6B, the calcined casting 74 was placed on a flat horizontal BN support plate 76 such that the disc portion faced downward and the shaft portion faced upward and was fired at 1,860° C. and atmospheric pressure in nitrogen gas for 6 hours under a load applied by a doughnut-shaped weight 78 (10 kg) placed on the disc portion. In this way, a ceramic heater 80 was obtained (the disc 12 had a diameter of 300 mm). Electrode exposure holes 14a and 16a were formed in the ceramic heater 80 to obtain a ceramic heater 10.

The ceramic heater 10 of Experimental Example 1 had a strength of 320 MPa, an average particle size of 4.1 μm, and a warpage after firing of 0.04 mm. No bubbles were found in the final compact 70. The strength was measured in accordance with JIS R 1601, and a test specimen was prepared so as to include the junction between the disc 12 and the shaft 20. The test specimen had a rectangular parallelepiped shape with a width W of 4.0 mm, a thickness t of 3.0 mm, and a length of 40 mm. This test specimen was placed on two supports arranged at a predetermined distance such that the junction was located in the center between the supports, and the maximum bending stress at which the test specimen was bent when a load was applied to two points separated from the center between the supports to the left and right by the same distance was measured. The average particle size was determined as the average particle size of 40 particles observed under a scanning electron microscope (SEM), and the particle size of each particle observed was determined as the average of the major and minor axes of the particle. The warpage was determined as the difference between the maximum and minimum heights of the wafer mounting surface 12a. The presence or absence of bubbles was determined by visual inspection of a cross-section of the final compact 70.

Experimental Example 2

1. Casting Step

A ceramic slurry precursor was prepared as in Experimental Example 1. To this ceramic slurry precursor, 4.5 parts by mass of an isocyanate (hexamethylene diisocyanate), 0.1 parts by mass of water, and 0.4 parts by mass of a catalyst (6-dimethylamino-1-hexanol) were added and mixed to obtain a ceramic slurry. This ceramic slurry was used to prepare a final compact 70 by the procedure shown in FIGS. 5A to 5J. The mold 40 had an angle of inclination θ of 0.5° and a height difference d of 1.3 mm. The heater electrode 14 and the RF electrode 16 were formed by screen printing with a Mo paste (containing aluminum nitride powder (purity: 99.7%)). Accordingly, the heater electrode groove 51a and the RF electrode groove 52a were omitted.

2. Drying, Debinding, and Calcining Steps

The resulting final compact 70 was dried at 100° C. for 10 hours and was then debinded and calcined at a maximum temperature of 1,300° C. in a hydrogen atmosphere to obtain a calcined casting 74.

3. Firing Step

After firing as in Experimental Example 1, electrode exposure holes 14a and 16a were formed to obtain a ceramic heater 10 of Experimental Example 2. The ceramic heater 10 of Experimental Example 2 had a strength of 335 MPa, an average particle size of 4.3 µm, and a warpage after firing of 0.04 mm. No bubbles were found in the final compact 70. As in Experimental Example 1, no bonding interface was found in the ceramic heater 10.

Experimental Example 3

1. Compaction Step

To 95% by weight of aluminum nitride powder, 5% by weight of yttrium oxide was added as a sintering aid, and they were mixed in a ball mill. A binder was added to the resulting powder mixture, and it was granulated by spray granulation. The resulting granulated powder was debinded and was subjected to mold compaction and cold isostatic pressing (CIP) to form a disc-shaped compact and a tubular compact. A Mo mesh serving as an RF electrode and a Mo coil serving as a heater electrode were embedded in the disc-shaped compact.

2. Firing Step

The disc-shaped compact was fired at 1,860° C. in nitrogen gas by hot pressing for 6 hours to obtain a fired disc-shaped compact. The tubular compact was fired at 1,860° C. and atmospheric pressure in nitrogen gas for 6 hours to obtain a fired tubular compact.

3. Bonding Step

The bonding surface of the fired disc-shaped compact and the bonding surface of the fired tubular compact were machined with a surface grinding machine and a high-speed lapping machine so that the centerline average roughness and flatness of the bonding surfaces were 0.1 µm. An yttrium nitrate solution having an yttrium concentration of $2.61 \times 10^{-4}$ mol/cc was applied to each bonding surface, and both bonding surfaces were placed on top of each other and were heat-treated at 1,860° C. for 1 hour to obtain a ceramic heater of Experimental Example 3. During heat treatment, each fired body was held and secured with a jig so that the two fired bodies were not considerably displaced from each other. During bonding, no pressure was applied to the two fired bodies, and the load applied thereto was the self weight of the fired bodies alone. The atmosphere during heat treatment was nitrogen gas. The ceramic heater of Experimental Example 3 had a strength of 290 MPa, an average particle size of 4.9 µm, and a warpage after firing of 0.15 mm. The fired disc-shaped compact and the fired tubular compact of the resulting ceramic heater were integrated together such that the bonding interface therebetween was identifiable under an SEM.

The present application claims priority from Japanese Patent Application No. 2019-058056 filed on Mar. 26, 2019, the entire contents of which are incorporated herein by reference.

What is claimed is:

1. A member for a semiconductor manufacturing apparatus comprising a ceramic disc incorporating an electrode and a ceramic cylindrical shaft supporting the disc,
    wherein the disc and the shaft are integrally formed and mutually have no bonding interface,
    the disc has a surface with which the shaft is integrated, the surface having a region inside the shaft and a region outside the shaft,
    the region inside the shaft is recessed by one step with respect to the region outside the shaft and has an electrode exposure hole through which the electrode is exposed,
    the shaft has an inner space including a first space extending from a position at a predetermined height with respect to the region of the disc inside the shaft to the region of the disc inside the shaft, the first space having a frustoconical shape whose diameter increases from the position at the predetermined height toward the region of the disc inside the shaft, and
    the inner space of the shaft includes a second space extending from the position at the predetermined height to an opening of the shaft, the second space having a frustoconical shape whose diameter increases from the position at the predetermined height toward the opening of the shaft.

2. The member for a semiconductor manufacturing apparatus according to claim 1,
    wherein the disc has a gas passage that is open in a side surface of the disc and that extends in a planar direction of the disc, and the shaft has a gas supply path which extends in a longitudinal direction and through which a gas is supplied to the gas passage.

3. The member for a semiconductor manufacturing apparatus according claim 1,
    wherein a boundary between an outer surface of the shaft and the surface of the disc with which the shaft is integrated is a round or tapered surface.

* * * * *